United States Patent
Li et al.

(10) Patent No.: US 9,324,855 B2
(45) Date of Patent: Apr. 26, 2016

(54) LATERAL POWER DEVICE HAVING LOW SPECIFIC ON-RESISTANCE AND USING HIGH-DIELECTRIC CONSTANT SOCKET STRUCTURE AND MANUFACTURING METHOD THEREFOR

(71) Applicant: UNIVERSITY OF ELECTRONIC SCIENCE AND TECHNOLOGY OF CHINA, Sichuan (CN)

(72) Inventors: Junhong Li, Sichuan (CN); Ping Li, Sichuan (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 14/650,176

(22) PCT Filed: Dec. 19, 2013

(86) PCT No.: PCT/CN2013/001594
§ 371 (c)(1),
(2) Date: Jun. 5, 2015

(87) PCT Pub. No.: WO2014/094362
PCT Pub. Date: Jun. 26, 2014

(65) Prior Publication Data
US 2015/0333170 A1 Nov. 19, 2015

(30) Foreign Application Priority Data

Dec. 20, 2012 (CN) .......................... 2012 1 0558464

(51) Int. Cl.
*H01L 29/66* (2006.01)
*H01L 29/78* (2006.01)
*H01L 29/40* (2006.01)
*H01L 29/06* (2006.01)

(52) U.S. Cl.
CPC ........ *H01L 29/7802* (2013.01); *H01L 29/0653* (2013.01); *H01L 29/405* (2013.01);
(Continued)

(58) Field of Classification Search
CPC ............ H01L 29/7802; H01L 29/7812; H01L 29/66712

USPC .......... 257/330, 331, 332, 334, 329; 438/156, 438/268
See application file for complete search history.

(56) References Cited

U.S. PATENT DOCUMENTS
7,230,310 B2    6/2007   Chen
2009/0096022 A1   4/2009   Chang et al.

FOREIGN PATENT DOCUMENTS
CN    1917150    2/2007
CN    102097482   6/2011
(Continued)

OTHER PUBLICATIONS
S. E. D. Habib, The ALDMOST: A New Power MOS Transistor. IEEE Electr. Dev. Lett. 8, 257-259, Jun. 1987.
(Continued)

*Primary Examiner* — Tan N Tran
(74) *Attorney, Agent, or Firm* — Leason Ellis LLP

(57) ABSTRACT

Provided is a lateral power device having low specific ON-resistance and using a high-dielectric constant socket structure and a manufacturing method therefor, which relate to semiconductor power devices. A source electrode (8) of the device is of a first conduction type, and a channel region (6), a silicon substrate (4) and an ohmic contact heavily-doped region are of a second conduction type; at least two isolation regions are arranged in an embedded manner in a drift region (1); between the isolation regions are the drift region (1) and the channel region (6); each isolation region extends from the source electrode (8) to a drain electrode (11); high-dielectric constant material strips (3) and first insulation dielectric layers (10) form boundaries of the bottoms and sidewalls of the isolation regions; the isolation regions are filled with a first filling material (2), a second insulation dielectric layer (9) is arranged on the upper surface of the drift region (1) and the upper surfaces of the isolation regions, and a gate electrode (5) directly contacts the first filling material (2) via holes on the second insulation dielectric layer (9); and a source electrode lead-out wire (16) and a drain electrode lead-out wire (12) directly contact the source electrode (8) and the drain electrode (11) respectively via the holes on the second insulation dielectric layer (9). The area of a power device can be greatly reduced on the premise of not reducing the withstand voltage and not increasing the specific ON-resistance.

14 Claims, 8 Drawing Sheets

(52) U.S. Cl.
CPC ........ *H01L29/407* (2013.01); *H01L 29/66712* (2013.01); *H01L 29/7812* (2013.01); *H01L 29/7816* (2013.01); *H01L 29/0634* (2013.01)

(56) References Cited

FOREIGN PATENT DOCUMENTS

| CN | 201110387593.8 | 11/2011 |
| --- | --- | --- |
| CN | 201210006353.3 | 1/2012 |
| CN | 103050540 | 4/2013 |

OTHER PUBLICATIONS

B. J. Baliga, T. Syau, and P. Venkatraman: The accumulation-mode field effect transistor: A new ultralow on-resistance MOSFET. IEEE Electr Dev. Lett. 13, 427-429, Aug. 1992.

X. Chen, J. Sin, Optimization of the specific On-resistance of the COOLMOS, IEEE Trans. Electr. Dev. 48, 344-348, Feb. 2001.

S E Jamali Mahabadi, Ali A Oroujil, P Keshavarzi, Hamid Amini Moghadam, A new partial SOI-LDMOSFET with a modified buried oxide layer for improving self-heating and breakdown voltage, Semiconductor Science and Technology, vol. 26, 095005-1-095005-12, Published Jul. 6, 2011.

Sajad A. Loan, S. Qureshi, S. Sundar Kumar Iyer, A Novel Partial-Ground-Plane-Based MOSFET on Selective Buried Oxide: 2-D Simulation Study, IEEE Transaction on electron devices, vol. 57, No. 3, 671-680, Mar. 2010.

Chu Fu-Tong, Chen, Chao, Zhou Wei, Liu Xing-Zhao, Improved Breakdown Voltage in AlGaN/GaN High Electron Mobility Transistors by Employing Polymide/Chromium Composite Thin Films as Surface Passivation and High-Permittivity Field Plates, Chinese Physics Letters, vol. 30, 097303-1-097303-4, Received Mar. 25, 2013.

LATERAL POWER DEVICE HAVING LOW SPECIFIC ON-RESISTANCE AND USING HIGH-DIELECTRIC CONSTANT SOCKET STRUCTURE AND MANUFACTURING METHOD THEREFOR

CROSS REFERENCE TO RELATED APPLICATIONS

The present application is a U.S. National Phase of International Patent Application PCT/CN2013/001594, filed Dec. 19, 2013, which claims priority to Chinese Application No. 201210558464.5, filed on Dec. 20, 2012, the entire contents of which are incorporated herein by reference.

FIELD OF INVENTION

This invention relates to semiconductor devices, in particular to the material and structure of voltage-sustaining layers for lateral semiconductor power device.

BACKGROUND OF THE INVENTION

It is well known that in a conventional lateral power device, the reverse voltage is sustained by a lightly doped semiconductor drift region, such as the Lateral Double Diffused Metal Oxide Semiconductor (LDMOS). If junction depth and doping concentration of drift region meet the RESURF (reduce the device surface field by reinforcing the body field) condition, the drift region will be fully depleted and space charges are introduced. Therefore, the LDMOS is capable of withstanding high voltage at the off-state. The RESURE condition reported by literature [J. A. Appels, M. G. Collet. P. Hart, H. Vaes, J. Verhoeven. Thin-layer HV-devices [J]. Philips Journal of Research, 1980, 35(1):1~13] is as below:

$$N_{epi}t_{epi} \leq 2 \times 10^{12} \sqrt{\frac{N_{epi}}{P_{sub}+N_{epi}}} \leq 1.4 \times 10^{12} \text{cm}^{-2}$$

The $P_{sub}$, $N_{epi}$, $t_{epi}$ are the doping concentration of P type substrate, doping concentration and junction depth of the drift region, respectively. Apparently, higher doping concentration or larger junction depth for drift region always provides lower specific on-resistance. However, observing from the above equation, the RESURF condition determines the upper limit for the product of the drift region doping concentration and junction depth. Consequently, the device specific on-resistance is confined to meet the RESURF condition for high breakdown voltage. In different from conventional LDMOS which only used N– doping in drift region, lateral Super Junction device used the drift region with alternating P– and N– doping. Because the mutual diffusing effect happens between N– and P– drift region, higher drift region doping concentration is allowed in the Super Junction so that the specific on-resistance is reduced. Although its performance is better than that of the RESURF LDMOS, the conduction of Super Junction still relies on drift region doping; its specific on-resistance is a limited under given breakdown voltage condition.

Under the same specific on-resistance, the breakdown voltage improvement is realized by the optimization of electric field distribution at the power device blocking state, and no additional methods are used to reduce the device specific on-resistance for above conventional techniques. Consequently, the specific on-resistance of the power device are still determined by drift region doping concentration and junction depth, the trade-off between high breakdown voltage and low specific on-resistance still exists. As revealed in literature [S. E. D. Habib, The ALDMOST: A New Power MOS Transistor. IEEE Electr. Dev. Lett. 8, 257-259 (1987)] and [B. J. Baliga, T. Syau, and P. Venkatraman: The accumulation-mode field effect transistor: A new ultralow on-resistance MOSFET. IEEE Electr Dev. Lett. 13, 427-429 (1992)], the accumulation effects can be introduced to the drift region by using thin $SiO_2$ dielectric, so that the electron carrier density is boosted with no additional doping, therefore, the specific on-resistance is reduced with the effect of accumulation effect under fixed drift region doping concentration and junction depth condition. However, because the permittivity of the $SiO_2$ is very low, the accumulation effect is limited; and the thin $SiO_2$ is also fragile for high voltage. Furthermore, the low permittivity of the $SiO_2$ may cause the potential gathering, which is negative for high breakdown voltage. In US patent, [X. Chen, Super-junction voltage sustaining layers with alternating semiconductor and high-K dielectric regions. U.S. Pat. No. 7,230,310, Jun. 12, (2007)], the high permittivity pillars are inserted into the drift region to modulate the potential distribution and improve the breakdown voltage, however, the high permittivity pillars has completely no contact with the gate, the carrier accumulation effect therefore will not happen at the device on state. As a result, the device specific on-resistance indicates no significant decrease than that of the Super junction.

SUMMARY OF THE INVENTION

The purpose of this invention is to provide a lateral junction high-K MOS device (LJHMOS) with low specific on-resistance for silicon power application.

The technical solution of this invention is to use the novel device structure with high permittivity sockets to reduce the specific on-resistance for lateral power device, comprising silicon substrate, drift region, the first dielectric layer, gate, channel region, ohm contact high doping region, source, drain, the second dielectric layer, source contact, drain contact. The drift region, drain, source are the first conductive type, and the channel region, silicon substrate, ohm contact high doping region are the second conductive type; at least two isolation regions are placed into the drift region; the drift region and channel region locate between the isolation regions; and each isolation extends from source to drain;

The boundaries of isolation region are formed by the high permittivity material sockets and the first dielectric layer, i.e. the sidewall boundaries of the isolation region at the direction from source to drain are high permittivity material sockets, the bottom boundary and the sidewall boundaries at the end faces are set to be the first dielectric layer.

The isolation regions are filled with the first filler material inside, the surface of both drift region and isolation region are covered by the second dielectric layer, gate contacts the first filler material through the via on the second dielectric layer; the second dielectric layer also covers the source, the drain, and the channel region; the source contact and drain contact connect to source and drain respectively through the via on the second dielectric layer.

Said the first dielectric layer comprises the end face sidewalls and bottom of the isolation region, both material of end face sidewall and bottom are high permittivity material; alternatively, one of the material for end face sidewalls and bottom is high permittivity material.

Furthermore, the isolation regions are in the shape of cuboids, the boundary sidewalls perpendicular to substrate and in the direction from source to drain are high permittivity material sockets.

The isolation regions are partially filled by the third filler material at the side of the source. The third filler material uses the same material as the gate, and the gate contacts the third filler material through the via on the second dielectric layer. The rest part of the isolation regions are filled by the first filler material, which is the same material as the high permittivity sockets.

Said the first filler material is P– or N– silicon.

Or, the internal high permittivity material sockets are placed in the middle of two adjacent high permittivity material sockets in the drift region among the isolation regions. The internal high permittivity material sockets parallel with the high permittivity material sockets and use the same material as the high permittivity material sockets, the ends of the internal high permittivity material socket directly contact the source and the drain.

Or, the internal high permittivity material sockets are placed inside of the isolation regions, which parallel with the high permittivity material sockets and use the same material as the high permittivity material sockets, the ends of internal high permittivity material sockets directly contact the source and the drain.

Moreover, buffer layers are deposited at the both sides of the high permittivity material socket, the material of buffer layers are insulation material, especially, the $SiO_2$.

Furthermore, the lateral insulation board is placed inside the isolation region; the insulation board divides the first filler material into two parts, the drain adjoining part and source adjoining part, the source adjoining part contacts the gate though the via on the second dielectric layer, and the drain adjoining part contacts the drain; the first filler material is used as the material for part of the first dielectric layer at the end face sidewall in the side of the drain. Under this condition, the end face sidewall of the first dielectric layer at the drain side and the drain adjoining part of the first filler material can be merged as one integral part.

Said the first conductive type is N type silicon, the second conductive type is P type silicon; or, the first conductive type is P type silicon, the second conductive type is N type silicon.

Said the material of high permittivity material socket is the dielectric material with actual dielectric constant larger than 3.9, or, the insulation material mixed with conductive particle, i.e. pseudo high permittivity material, or, the composite material consists of both pseudo high permittivity material and insulation material with actual dielectric constant larger than 3.9.

This invention also provides the method for the fabrication of the LJHMOS, the steps are as below:
1) The photoresist is coated on the surface of SOI wafer, then photoetched, developed and hardened, which is followed by the steps of ion implant with photoresist barrier, anneal, drive in, and wafer rinse; the above steps are repeated to finish all of the silicon doping including lateral super junction with alternating N– & P– doping, the channel region doping and heavy doping for drain and source.
2) Use the $SiO_2$ burier isolation of the SOI wafer as the bottom 102 of the first dielectric layers, which isolates the first filler material from the substrate; meanwhile, the $SiO_2$ burier isolation of the SOI also isolates the drift region from the substrate.
3) Etch the wafer by RIE (Reactive Ion Etching) to make the trench from wafer surface to $SiO_2$ burier isolation, fill the trench with high permittivity material and the first dielectric layer 10, then, deposit the second dielectric layer;
4) After the second dielectric layer is deposited, the second dielectric layer is etched with photoresist barrier to form the via, then, the metal are deposited and etched to form the drain contact, the source contact and the metal gate.

This invention also provides the alternative method for the fabrication of the LJHMOS, the steps are as below:
1) Have the N type epitaxial growth on a none-SOI P type wafer, which is followed by the high energy oxide partial implantation with barrier on wafer surface to form burier layer as the bottom 102 of the first dielectric layer 10.
2) Coat the photoresist on the surface of the wafer, then photoetched, developed and hardened, which is followed by the steps of ion implant with photoresist barrier, anneal, drive in, and wafer rinse; the above steps are repeated to finish all of the silicon doping including lateral super junction with alternating N– & P– doping, the channel region doping and heavy doping for drain and source.
3) Etch wafer using the RIE (Reactive Ion Etching) to make the trench from wafer surface to $SiO_2$ burier isolation, fill the trench with high permittivity material sockets and the first dielectric layer to isolate the first filler material from substrate and drift region, then, deposit the second dielectric layer and etch the via, finally, deposit and etch the metal to finish the fabrication process.

Said the first conductive type is N doped silicon, the second conductive is P doped silicon; or, the first conductive type is P doped silicon, the second conductive is N doped silicon.

At the off-state of the LJHMOS proposed in this invention, the charge balance and potential modulation effects co-exist because both PN alternating super junction structure and high permittivity material are used in the drift region to guarantee uniform potential distribution and high breakdown voltage. More importantly, because the gate directly contacts the first filler material inside the isolation region, so that the first filler material shares the same potential as the gate; additionally, the potential in the drift region is much lower than the gate. The strong accumulation effect is generated in the drift region at the both sides of isolation region through the high permittivity material sockets. As the result, massive electron charges are absorbed to the interface of the drift region and high permittivity sockets; the carrier density at the drift region is significantly increased with no additional drift region doping; the device specific on-resistance will be reduced in orders of magnitude.

On the other hand, strong accumulation effect also introduces some negative effects to the performance of the power device. The LJHMOS proposed in this invention exhibits large parasitic capacitor between gate and drain, which causes large switch loss. In actual application, it is advisable to transfer the merit of low specific on-resistance of the LJHMOS to the shrinking of the device size. With such small device specific on-resistance of this invention, the device gains much lower total on-resistance under the same area condition compared with the conventional device; on other hand, the area of the LJHMOS could be much smaller than the conventional device under the condition of the same on-resistance. As the parasitic capacitance always decreases with the shrinking of the device area, when the device is designed with a smaller size, the negative effect caused by parasitic capacitance will be significantly reduced or even eliminated. Therefore, under the condition of similar on-resistance, switch loss, and breakdown voltage, the LJHMOS allows much smaller device area than that of the super junction device. Above all, the advantage of this invention in actual application is that the power device size can be significantly reduced with no decreasing of breakdown voltage and no increasing of specific on-resistance.

BRIEF DESCRIPTION OF THE DRAWING FIGURES

FIG. 1~FIG. 4 are the device three-dimension cross section views for embodiment 1.

FIG. 1A and FIG. 1B show the vertical cross section views for the device isolation region on the left, FIG. 2 shows the lateral cross section view based on FIG. 1, FIG. 3 shows the vertical cross section view at the device midline in the drift region, FIG. 4 shows the top view of cross section view at the surface of the drift region and isolation region (only one isolation region is showed). The first dielectric layer 10 is showed in FIG. 1A as one integral, FIG. 1B shows the components of the first isolation region, including the bottom 102 and the end face sidewall 103.

FIG. 5~FIG. 7 are the device three-dimension cross section views for embodiment 2.

FIG. 5 shows the vertical cross section view for the device isolation region on the left, FIG. 6 shows the lateral cross section view based on FIG. 5, FIG. 7 shows the top view of cross section view at the surface of the drift region and isolation region (only one isolation region is showed).

FIG. 8~FIG. 10 are the device three-dimension cross section views for embodiment 4.

FIG. 8 shows the vertical cross section view for the device isolation region on the left, FIG. 9 shows the lateral cross section view based on FIG. 8, FIG. 10 shows the top view of cross section view at the surface of drift region and isolation region (only one isolation region is showed).

FIG. 11~FIG. 12 are the device three-dimension cross section views for embodiment 5.

FIG. 11 shows the vertical cross section view of the device isolation region on the left, FIG. 12 shows the lateral cross section view based on FIG. 11.

FIG. 13~FIG. 14 are the device three-dimension cross section views for embodiment 6.

Figure 1A:
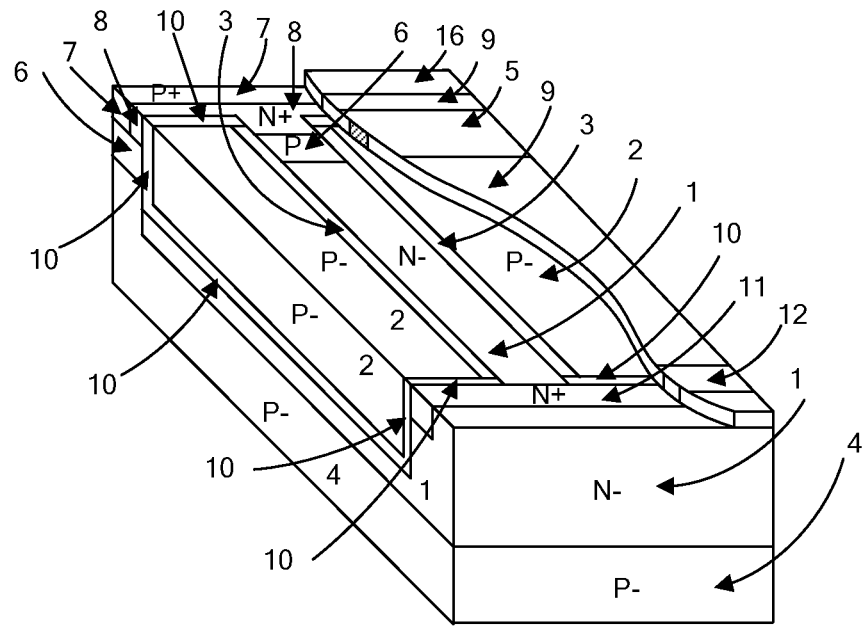

Notation: drift region 1, the first filler material 2, high permittivity material socket 3, gate 5, channel region 6, Ohm contact heavy doping region 7, source 8, the second dielectric layer 9, the first dielectric layer 10, the first dielectric layer bottom 102, the first dielectric layer end face sidewall 103, drain 11, drain contact 12, internal high permittivity material socket 13, buffer layer 15, source contact 16, the third filler material 51, insulation board 101.

DETAILED DESCRIPTION OF PREFERRED EMBODIMENTS

In FIG. 1, 2, 3, 5, 6, 8, 9, 11, 12, 13, the shadow at the second dielectric layer 9 indicates the position of the via.

As showed in FIG. 1, 2, 3, 4, this invention includes substrate 4, drift region 1, gate 5, channel region 6, ohm contact heavy doping region 7, source 8, drain 11, source contact 16, drain contact 12. The drift region 1, drain 11, and source 8 are the first conductive type, the channel region 6, substrate 4, ohm contact heavy doping region 7 are the second conductive type. At least two isolation region are placed into the drift region 1; the drift region 1 and channel region 6 locate between the adjoining isolation regions; and each isolation extends from source 8 to drain 11; the boundaries of isolation region are formed by high permittivity material socket 3 and the first dielectric layer 10; the isolation regions are filled with the first filler material 2 inside, the surface of both drift region 1 and isolation region are covered by the second dielectric layer 9, gate 5 contacts the first filler material 2 through the via on the second dielectric layer 9; the second dielectric layer 9 also covers the source 8, drain 11, and the channel region 6, the source contact 16 and drain contact 12 connect to source 8 and drain 11 respectively through the via on the second dielectric layer 9.

Said the first dielectric layer comprises the end face sidewalls and bottom of the isolation region, both material of the end face sidewalls and bottom are high permittivity material; alternatively, one of the material for the end face sidewalls and bottom is high permittivity material.

The invention uses the silicon substrate as the base, the 'upper surface' claimed in the text suggests the surface upward in FIG. 1.

Figure 1B:
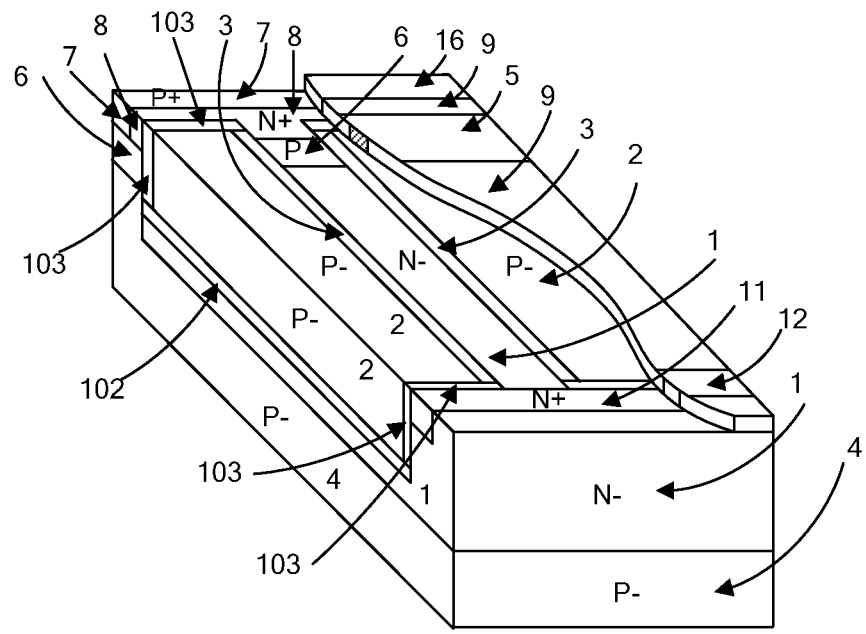
Figure 2:
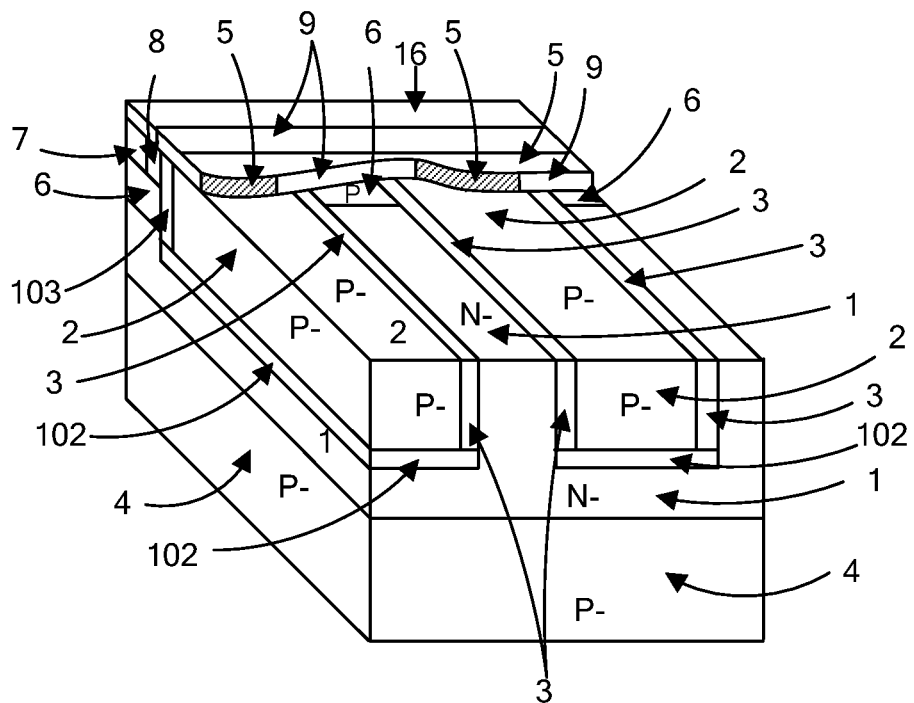
Figure 3:
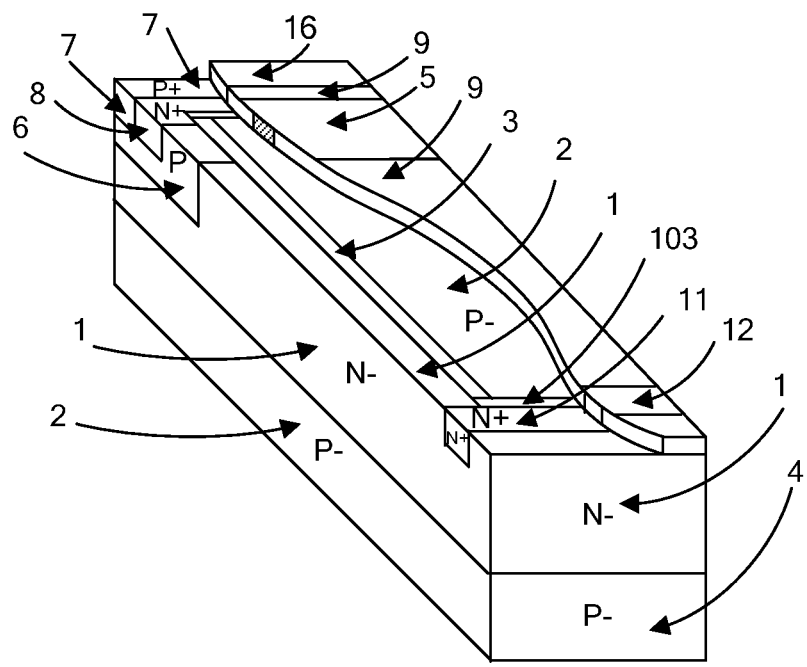

FIG. 1B shows a typical embodiment of this invention, the first filler material 2 is the P silicon. The first dielectric layer comprises end face sidewall 103 and bottom 102, the material of the end face sidewall 103 and bottom 102 are same as the high permittivity material socket; alternatively, one of the materials for end face sidewall 103 and bottom 102 is high permittivity material, the other is different types of dielectric material, for instance, the $SiO_2$.

Because the existence of the first dielectric layer 10 and high permittivity material socket 3, the first filler material 2 is completely isolated from the drift region 1, channel region 6, source 8, and drain 11, but directly contacts the gate 5 through the via on the second dielectric layer 9. When the voltage of the gate 5 is low, the device is at the blocking state. According to the analysis in literature [X. Chen, J. Sin, Optimization of the specific On-resistance of the COOLMOS. IEEE Trans. Electr. Dev. 48, 344-348 (2000], because there is potential difference between the N− doped silicon drift region 1 and the P− doped silicon the first filler material 2, also, the lateral dielectric isolation directly contacts the drift region 1 and the first filler material 2 respectively with it both sides, consequently, potential difference exists between both sides of the isolation dielectric. (if the interaction between drift region 1 and the first filler material 2 is not considered, the major potential drop in the N− drift region 1 concentrated at the PN junction of the channel region 6 and drift region 1, while the major potential drop of the P− doped silicon first filler material 2 is at the end face sidewall 103 of the first dielectric material close to drain) Even if the $SiO_2$ is used as the dielectric isolation instead of the high permittivity socket 3, the potential in drift region 1 and the first filler material 2 will interact with each other if the $SiO_2$ is thin enough. The electric field will be generated inside of the isolation dielectric, which produces the space charges in both of the N doped drift region and P doped the first filler material, so that the charge balance effect will appear to realize the high breakdown voltage like the super junction. This invention isolates the N doped drift region 1 and P doped the first filler material 2 with high permittivity socket 3. Because of its high permittivity, even with thick high permittivity material socket 3, the strong electric field will be generated inside the high permittivity material socket 3 by the potential difference between the drift region 1 and the first filler material 2. Therefore, massive space charges are introduced into both of the drift region 1 and the second filler material 2, then, the super junction charge balance effect is realized. On other hand, the introduction of the high permittivity material boosts the average permittivity between drain 11 and source 8, according to Poisson's equation, the slope of the electric field distribution in the drift region with single type of doping is given by: $qN_D/\varepsilon$, which indicates that higher permittivity with larger c provides smaller electric field slope and better potential distribution. Therefore, the higher breakdown voltage will be achieved. Hence, the high permittivity material exhibits the capability of potential modulation. The device in FIG. 1 proposed in this invention utilizes both effects of Super Junction charge balance and high permittivity material potential modulation to optimize the potential distribution in the drift region, therefore, this device still has the breakdown voltage improvement compared with the conventional Super Junction device. Furthermore, as there is dielectric isolation exists between drift region 1 and the first filler material 2, the mutual breakdown will not happen, which allows higher drift region doping to realize smaller specific on-resistance.

Figure 4:
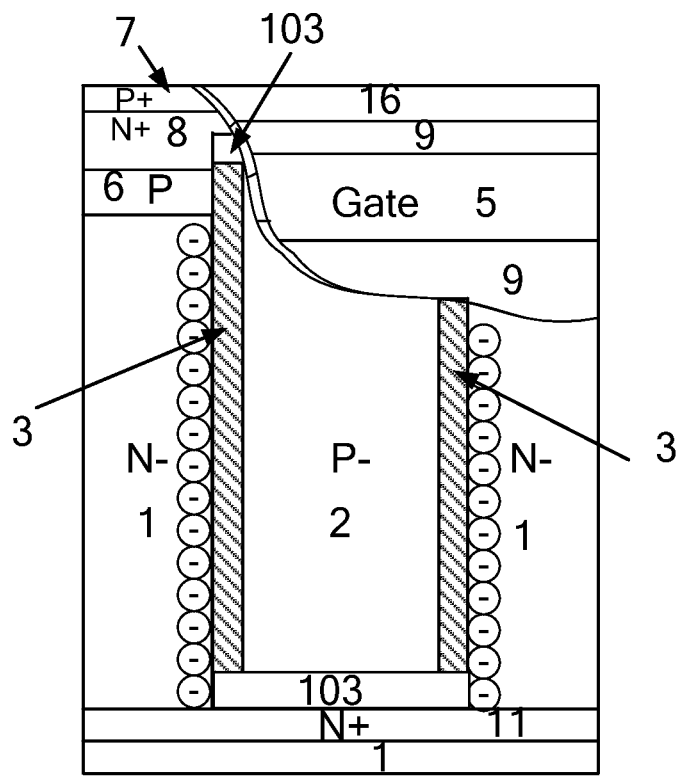

Although the device proposed in US patent [X. Chen, Super-junction voltage sustaining layers with alternating semiconductor and high-K dielectric regions. U.S. Pat. No. 7,230,310, Jun. 12, (2007)] also used the potential modulation effect of high permittivity material to achieve the uniform potential distribution in drift region, however, as the high permittivity material does not contact the gate, the device specific on-resistance will not be reduced. Whereas the LJHMOS propose in this invention is capable of reducing the device specific on-resistance in orders of magnitude besides guaranteeing the high breakdown voltage. As shown in FIG. 1, when the gate 5 voltage is high, the device is turned on. Because the first filler material 2 is isolated from drain 11, source 8, substrate 4, and drift region 1 by the first dielectric 10 and high permittivity socket 3, therefore, there are no conduction paths from the gate 5 to the drain 11, source 8, substrate 4, and drift region 1. Whereas the first filler material 2 doped with P directly contacts the gate 5, it will share the same potential as the gate 5, and this potential will generate strong accumulation effect at the N doped drift region 1 through the high permittivity material socket. Because the high permittivity material socket 3 is high dielectric constant material, the accumulation effect is going to be very strong, which introduces massive carrier charges at the interface of N doped silicon drift region 1 and high permittivity material socket 3 (as shown in FIG. 4). A low resistance conduction path is formed directly connecting the drain 11 and the source 8, the specific on-resistance is therefore reduced in orders of magnitude compared with the Super Junction under the same breakdown voltage.

Apparently, the introduction of the high permittivity material and strong accumulation effect will cause large parasitic capacitance between the gate 5 and the drain 11 under the same device area condition, which significantly increases the device switching loss. In the actual application of this invention, it is advisable to use the LJHMOS proposed by this invention in small size, so that the area of the parasitic capacitor is reduced, which will have low parasitic capacitance for its small size, therefore, its impact to switch loss will be minimized. In another word, it is possible to transfer the orders of magnitude specific on-resistance reduction of this invention to the sharply shrinking of the device size, the negative impact caused by the parasitic capacitance can be significantly weakened or even eliminated. Although the LJHMOS proposed in this invention with small area may cause insignificant reduction of the total on-resistance compared to the conventional power device with large area, however, this invention gains the significant area cost down under the same performance condition.

For the fabrication, the first method to realize this invention is based on SOI wafer. Firstly, the photoresist is coated on the surface of a SOI wafer, then photoetched, developed and hardened with conventional process, which is followed by the steps of ion implant with photoresist barrier, anneal, drive in, and wafer rinse; the above steps are repeated to finish all of the silicon doping including lateral super junction with alternating N– & P– doping, the channel region doping and heavy doping for drain and source. Next, use the $SiO_2$ burier isolation of SOI wafer as the bottom 102 of the first dielectric layers 10, which isolates the first filler material 2 to the substrate 4; meanwhile, the $SiO_2$ burier isolation of SOI also isolates the drift region 1 and the substrate 4. Then, etch wafer using the RIE (Reactive Ion Etching) to make the trench from wafer surface to $SiO_2$ burier isolation, fill the trench with high permittivity material and the first dielectric layer 10 at the end face sidewall 103, after that, deposit the second dielectric layer 9. If the material of the second dielectric layer 9 is $SiO_2$, it can be deposited by conventional oxidation or chemical vapor deposition(CVD); alternatively, if the second dielectric layer 9 is high permittivity material, it is possible to be deposited by radio frequency magnetron sputtering, and also, it can be formed simultaneously when filling the trench with high permittivity material using the Sol Gel or CVD. After the second dielectric layer 9 is deposited, the second dielectric layer 9 is etch with photoresist barrier to form the via, then, the metal are deposited and etched to form the drain contact 16, source contact 12, and metal gate 5 using the conventional method.

The second fabrication method: have the N type epitaxial grow on a none-SOI P type wafer. Then, use the method of high energy oxide partial implantation as reported in literature[S E Jamali Mahabadi, Ali A Oroujil, P Keshavarzi, Hamid Amini Moghadam, A new partial SOI-LDMOSFET with a modified buried oxide layer for improving self-heating and breakdown voltage, Semiconductor Science and Technology, vol. 26, 095005-1~095005-12 (2011)] or [Sajad A. Loan, S. Qureshi, S. Sundar Kumar Iyer, A Novel Partial-Ground-Plane-Based MOSFET on Selective Buried Oxide: 2-D Simulation Study, IEEE Transaction on electron devices, vol. 57, No. 3, 671~680 (2010)] to form the bottom 102 $SiO_2$ burier layer of the first dielectric layer 10. Next, coat the photoresist on the surface of the wafer, then photoetched, developed and hardened, which is followed by the steps of ion implant with photoresist barrier, anneal, drive in, and wafer rinse using the conventional method. The above steps are repeated to finish all of the silicon doping including lateral alternating N– & P– doping for super junction, the channel region doping and heavy doping for drain and source. After that, etch the wafer using the RIE (Reactive Ion Etching) to make the trench from wafer surface to $SiO_2$ burier isolation, fill the trench with high permittivity material sockets 3 and the first dielectric layer 10 at the end face sidewall 103, then, similar to the first fabrication method, deposit the second dielectric layer 9 on wafer surface and etch the contact, finally, deposit and etch the metal to finish fabrication.

Although the second fabrication method is more complicated than the first fabrication method, whereas the buried oxide layer is formed by high energy oxide partial implantation, so that the buried oxide layer only exists at the bottom of the first filler material and no dielectric layer exists at the bottom of drift region 1. Moreover, the $SiO_2$ buried oxide layer for the bottom 102 of the first filler material 2 is not necessarily deposited at the interface of the epitaxial layer and the substrate 4, which can be implanted inside of the drift region 1. As a result, the drift region 1 will completely enclose the isolation region at its bottom and both sides to realize wider conductive path and smaller specific on-resistance than that of the first method.

Refer to high permittivity material selection, it is possible to use the mature $HfO_2$ as the high permittivity material, alternative, the material with even higher permittivity such as PZT, BST, and BZN deposited by the methods of radio frequency magnetron sputtering, Sol Gel, or atomic layer deposition are also the options. Whereas the pseudo high permittivity material (the dielectric material mixed with metal particles) proposed in literature [Chen Xingbi, Pressure-proof layer formed by insulator with conductive particles of semiconductor device and semiconductor, Chinese Patent, CN201110387593.8, 2011.11.30] and [Chen Xingbi, Surface voltage-resisting area for semiconductor device, semiconductor device and capacitor, Chinese Patent, CN201210006353.3, 2012.01.11] are preferred. According to the analysis in literature [CHU Fu-Tong, CHEN. Chao, ZHOU Wei, LIU Xing-Zhao, Improved Breakdown Voltage in AlGaN/GaN High Electron Mobility Transistors by Employing Polyimide/Chromium Composite Thin Films as Surface Passivation and High-Permittivity Field Plates, Chinese Physics Letters, vol. 30, 097303-1~097303-4 (2013)], the pseudo high permittivity material can be deposited by evaporation, which is very fast. The permittivity of the pseudo high permittivity material increases with the rise of the metal particle proportion, however, the material conductance also increases with the rise of the metal particle proportion. To prevent the short circuit caused by the direct contact of silicon and the pseudo high permittivity material, it is possible to deposit a thin $SiO_2$ buffer layer 15 inside of the trench before filling the pseudo high permittivity material in.

MORE DETAILED EMBODIMENTS

Embodiment 1

This embodiment uses the P– doped silicon as the material for substrate 4 and the first filler material 2 inside the isolation region, and uses the N doped conductive type silicon as the drift region 1. Besides, this embodiment 1 also comprises the channel region 6, ohm contact heavy doping region 7, source 8, gate 5, drain 11, drain contact 12, source contact 16, high permittivity material socket 3, the first dielectric layer 10 (including the bottom 102 and end face sidewall 103), and the second dielectric layer 9 using $SiO_2$ or high permittivity material. At least two isolation regions are placed into the drift region 1; the drift region 1 and channel region 6 locate between the adjoining isolation regions; and each isolation extends from source 8 to drain 11; the boundary of isolation regions are formed by high permittivity material socket 3 and the first dielectric layer 10; the bottom 102 of the first dielectric layer 10 locates at the bottom of the first filler material 2, the end face sidewalls 103 locate at the first filler material 2 interfaces to both source 8 and drain 11, the isolation regions are filled with the first filler material 2 inside, the surface of both drift region 1 and isolation regions are covered by the second dielectric layer 9. The shape of isolation regions are cuboids, the material of the boundary sidewalls perpendicular to substrate 4 and in the direction from source 8 to drain 11 are high permittivity material sockets 3.

The end face sidewall 103 and bottom 102 material of the first dielectric layer 10 may be the same as the high permittivity material 3, also could be the other dielectric materials. The material of the end face sidewall 103 and bottom 102 could be the same or different. Gate 5 contacts the first filler material 2 through the via on the second dielectric layer 9; the second dielectric layer 9 also covers the source 8, drain 11, and the channel region 6. The source contact 16 and drain contact 12 connect to source 8 and drain 11 respectively through the via on the second dielectric layer 9.

When the device is at the blocking state, although the there are high permittivity material socket 3 isolations exist, the alternating N– (drift region 1) and P– doped (the first filler material 2) silicon will sill generate the Super Junction charge balance; additionally, the introduction of the high permittivity material increases the average permittivity between the source 8 and drain 11, according to Poisson's equation, the slope of the electric field distribution in the drift region with single type of doping is given by: $qN_D/\in$, which indicates that higher permittivity with larger c provides smaller electric field slope and better potential distribution. This embodiment utilizes both effects of Super Junction charge balance and high permittivity material potential modulation to optimize the potential distribution in the drift region. Results from the above two mechanism, the electric field concentrated at the PN junction will be more uniformly distributed. Therefore, this device still has the breakdown voltage improvement compared with the conventional Super Junction device. Furthermore, as there is high permittivity sockets 3 exists between drift region 1 and the first filler material 2, the breakdown between 1 and 2 will not happen, which allows higher drift region doping to realize smaller specific on-resistance. When the gate 5 voltage is high and the device is turned on, because the first filler material 2 is isolated from the drain 11, source 8, substrate 4, and the drift region 1 by the first dielectric 10 and high permittivity socket 3, therefore, there are no conduction paths from gate 5 to drain 11, source 8, substrate 4, and drift region 1. Whereas the first filler material 2 directly contacts the gate 5 through the via on the second dielectric layer, it will share the same potential as the gate 5, this potential will generate strong accumulation effect at the N doped drift region 1 through the high permittivity material socket. Because the dielectric constant of the high permittivity material socket 3 is very large, the accumulation effect is going to be very strong, which introduces massive carrier charges at the interface of N doped silicon drift region 1 and high permittivity material socket 3 (as shown in FIG. 4). A low resistance conduction path is formed directly connecting the drain 11 and source 8. If the dielectric constant of the high permittivity socket 3 is larger than 1000, the specific on-resistance of this embodiment will be reduced in orders of magnitude compared with the Super Junction under the same breakdown voltage condition.

Embodiment 2

Figure 5:
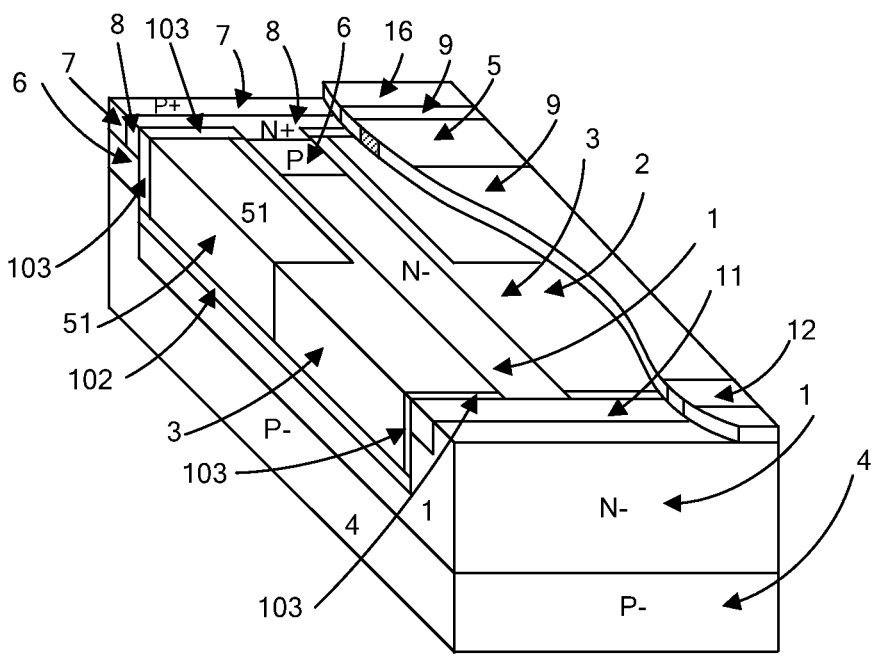
Figure 6:
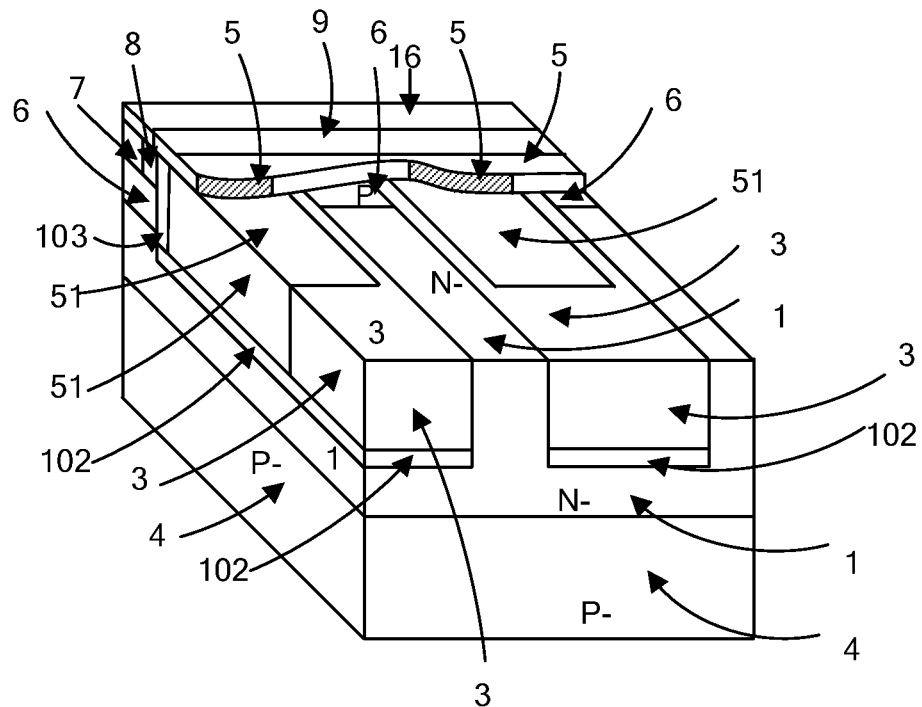
Figure 7:
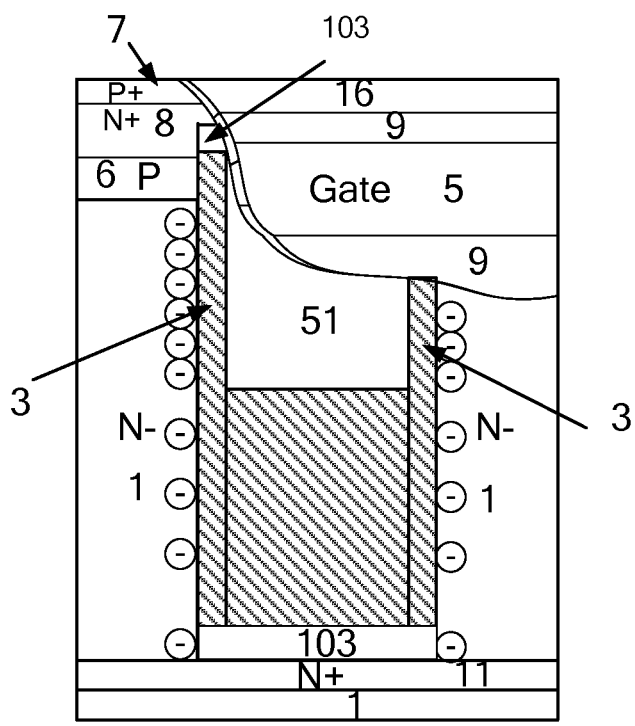

As shown in FIG. 5-7. This embodiment uses the P– silicon as the substrate 4, and uses the N– silicon as the drift region 1. The isolation regions are partially filled by the third filler material 51 at the side of the source. The third filler material uses the same material as the gate 5, and the gate 5 contacts the third filler material 51 through the via (the shadow part in the FIG. 5) on the second dielectric layer 9, the rest part of the isolations are filled by the first filler material 2, which is the same material as the high permittivity sockets 3. The source contact 16 connects the source 8 and ohm contact heavy doping region 7 through the via on the second dielectric layer 9, the drain 11 contacts drain contact through the via on the second dielectric layer 9.

Although this embodiment only uses the potential modulation effect of high permittivity to optimize the potential distribution without N&P alternating structure, whereas the high permittivity material takes larger proportion in the drift region, which significantly boosts the average permittivity between drain 11 and source 8. Consequently, the potential modulation effect is much stronger than the embodiment 1. On the other hand, the potential distribution in the drift region 1 close to drain 11 is uniform, however, the third filler material 51 is conductor, which will introduce the ground potential into the isolation region when device turn-off. That is equivalent to reduce the length of the drift region 1, the device breakdown voltage will decrease compared to the embodiment 1. The ratio of the breakdown voltage reduction is approximately the length of the third filler material 51 over the total length of the drift region. When device is turned on, the strong accumulation effect still happens like the embodiment 1 but only in the upper part of the drift region 1 at the side of the third filler material 51 as shown in FIG. 7. Definitely, larger length of the third filler material 51 always gives stronger accumulation effect although more breakdown voltage will be sacrificed. And also, because of the high dielectric constant of the high permittivity sockets 3, the rest part of the drift region also has some accumulation effect although with a longer distance to the third filler material 51. This embodiment is easy for fabrication, where no lateral Super Junction structure is needed. The device specific on-resistance is reduced by sacrificing the breakdown voltage to reinforce the accumulation effect of the device. In actual application, it is possible to adjust the length of the third filler material according to the different situation to meet the actual application requirements.

Embodiment 3

The difference between this embodiment and the embodiment 1 is that the material of first filler material 2 is N− silicon for this embodiment. Also, this embodiment uses the P− and N− as the silicon substrate 4 and drift region 1, respectively.

As the material of the first filler material 2 is not the P− silicon for this embodiment, the potential distribution optimization only relies on the modulation effect of the high permittivity material. However, the proportion of the high permittivity in the drift region is lower than that of the embodiment 2, the average permittivity improvement between drain 11 and source 8 is limited. Consequently, the breakdown voltage of this embodiment is lower than that of the embodiment 1. Although the N− silicon is used as the first filler material inside the isolation region, the N− silicon direct contacts the gate 5 but isolated from drain 11, the strong accumulation effect will happen in the entire drift region at the device on state like embodiment 1. As a result, the specific will be also reduced in orders of magnitude. The fabrication of the embodiment is much easier than the embodiment 1 because Super Junction structure is not needed.

Embodiment 4

According to Poisson's equation, the slope of the electric field distribution in the drift region with single type of doping is given by: $qN_D/c$. If the high permittivity sockets take larger proportion in drift region, the average permittivity between drain 11 and source 8 also goes larger; the electric field slope is smaller and potential distribution goes better. Although the optimization of the potential distribution at the device blocking state by the high permittivity material potential modulation effect is reported in US patent [X. Chen, Super-junction voltage sustaining layers with alternating semiconductor and high-K dielectric regions. U.S. Pat. No. 7,230,310, Jun. 12, (2007)], the device has no accumulation effect, the conducting path is determined by the length, width, and doping concentration of the semiconductor drift region. Increase the proportion of the high permittivity socket in drift region will boost the breakdown voltage according to Poisson's equation, however, it will take-up the proportion of semiconductor in drift region, i.e. much narrower current conducting path, which will result in the increase of the specific on-resistance under the same area condition. On contrast, this invention take advantage of the accumulation effect to reduce the specific on-resistance, the device specific on-resistance is major determined by how strong the accumulation effect is instead of the length, width, and doping concentration of the semiconductor drift region. As a result, when the device breakdown voltage is boosted by increasing the proportion of high permittivity sockets, there will be almost no impact to the specific on-resistance.

Figure 8:
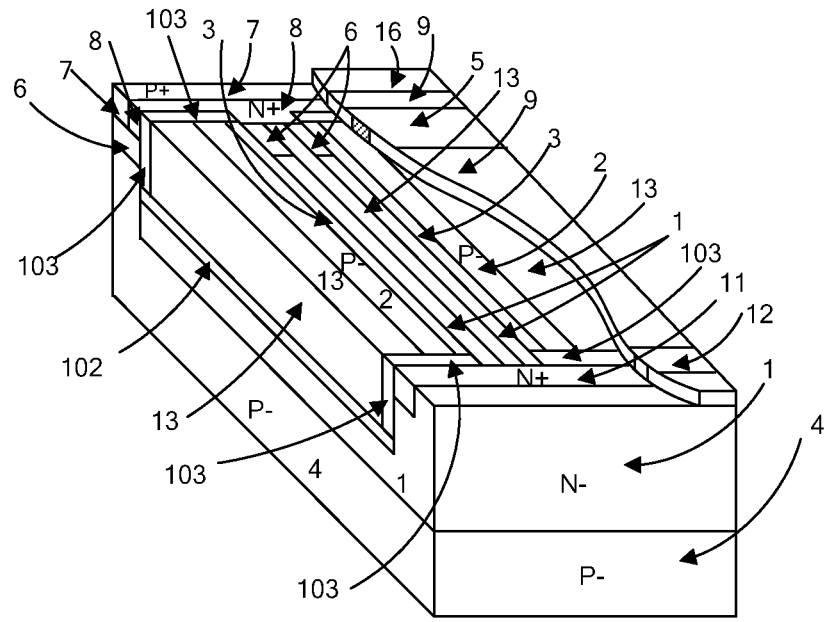
Figure 9:
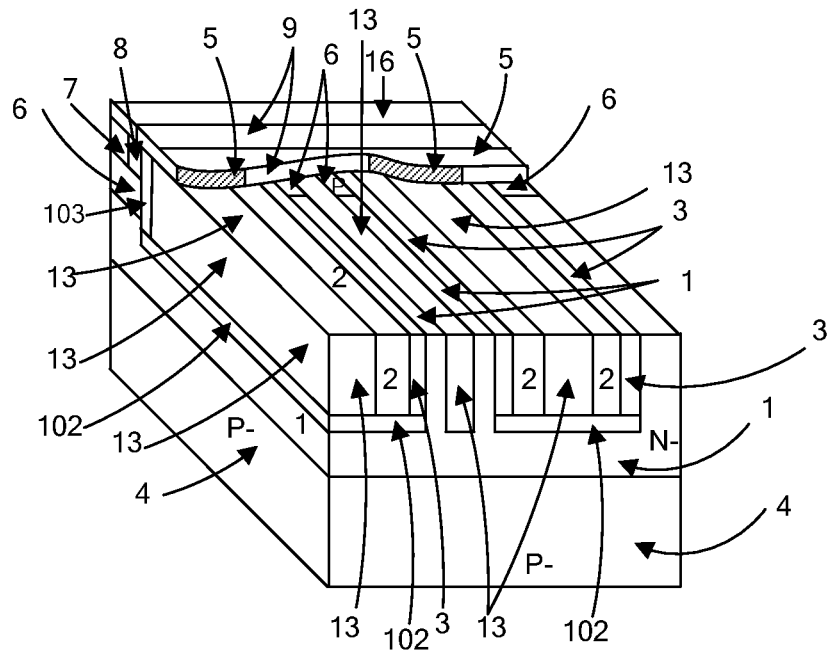
Figure 10:
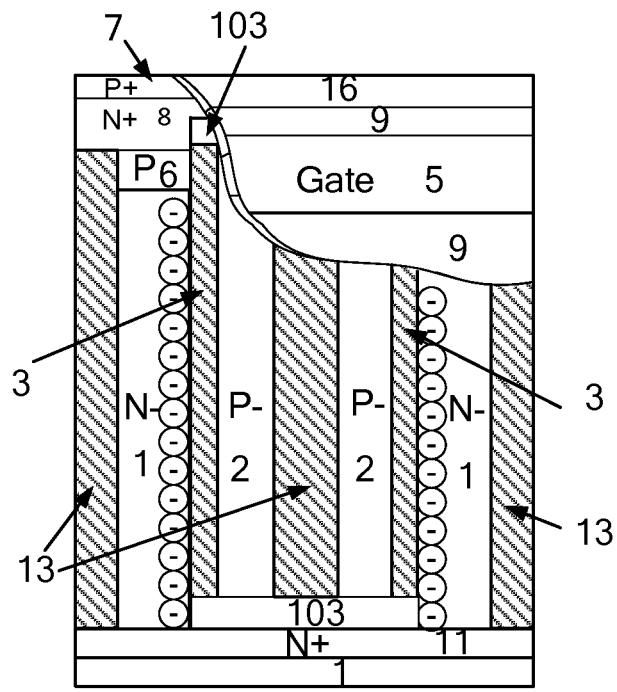

As shown in FIG. 8-10, this embodiment uses the P− and N− as the silicon substrate 4 and drift region 1, respectively. The first filler material 2 is used as the filler material for isolation region filling.

The internal high permittivity material sockets 13 are placed in the middle of two adjacent high permittivity material sockets 3 among the isolation regions in drift region 1, or in the middle of the isolation regions. The material of the internal high permittivity material sockets 13 are the same as the high permittivity material sockets 3, the ends of the internal high permittivity material sockets 13 contacts source 8 and drain 11, respectively.

The internal high permittivity material sockets 13 could be added in the middle of the drift region 1, or in the middle of the first filler material 2, or, in both of the above, i.e. the internal high permittivity material sockets 13 could be placed inside the isolation region, or between the isolation regions.

In this embodiment, the high permittivity material takes larger proportion in the drift region 1, so that the average permittivity between drain 11 and source 8 are significantly boosted, which is larger than the embodiment 1. Meanwhile, P− silicon is used as the first filler material 2, the Super Junction charge balance exists in this embodiment. The above effect allows almost ideal potential distribution in this embodiment. At the device on state, the first filler material 2 shares the same potential as the gate 5, the accumulation effect will happen at the entire drift region 1 like the embodiment 1. This embodiment could provide the best performance in all embodiments. As shown in FIG. 10, if the material with dielectric constant larger than 1000 is used as the high permittivity socket 3, this embodiment could realize specific on-resistance reduction in 3 orders of magnitude compared with the Super Junction under the same breakdown voltage.

Embodiment 5

Figure 11:
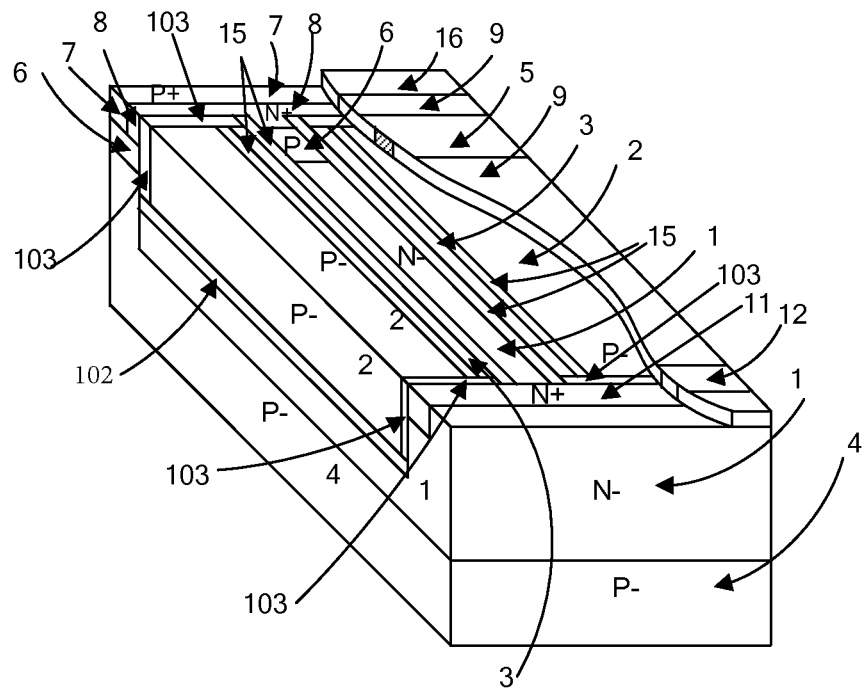
Figure 12:
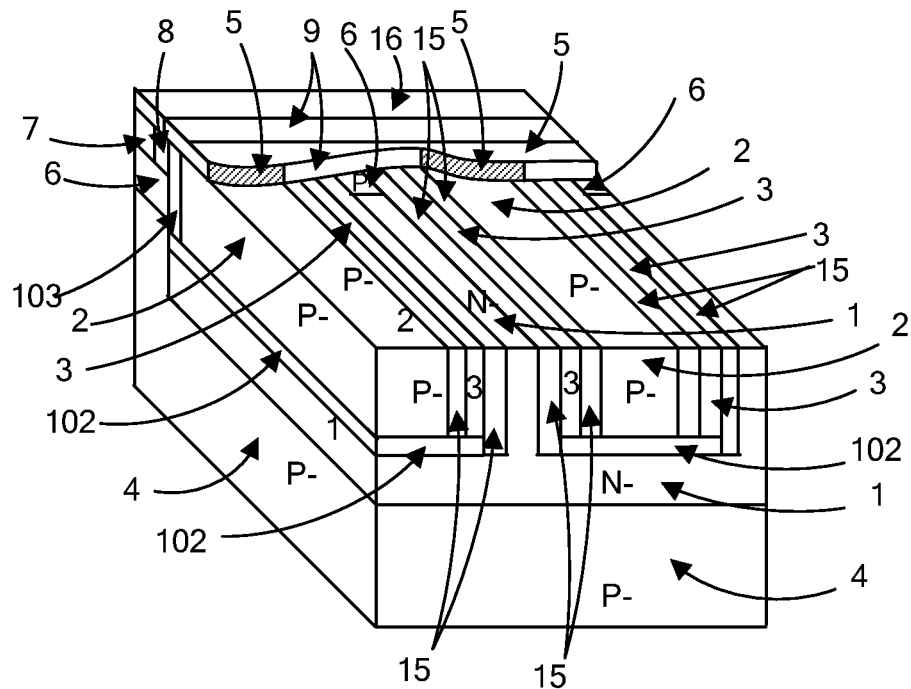

As showed in FIG. 11-12. Several high permittivity materials need the high temperature anneal process to activate their high permittivity. However, because high permittivity socket 3 directly contacts the silicon drift region 1 and the first filler material 2, crack will happen during the anneal process due to different thermal coefficient between the silicon and high permittivity material. Base on the above embodiments, it is possible to deposit a buffer layer 15 at the high permittivity material sockets interfaces of the drift region 1 and the first filler material 2, so that the thermal stress will be absorbed and the cracking could be prevented. The buffer layer could be the machinable ceramics.

Furthermore, the conductance of the pseudo high permittivity material also rises with the dielectric constant. If pseudo high permittivity material with high permittivity is used as the material of the high permittivity material socket 3, to prevent the short circuit between pseudo high permittivity material and the silicon, it is possible to deposit a buffer layer 15 at the high permittivity material sockets interfaces with the drift region 1 and the first filler material 2 base on the above embodiments to prevent the short circuit happen. The buffer layer could be the SiO$_2$, or other dielectric material.

Embodiment 6

For the both conventional lateral and vertical MOS device, when the device is operating at the triode region, the on-resistance between drain and source will increase as the increase of the drain-source voltage, which is the positive feedback. Consequently, when the drain-source current rises linearly, the rise of the drain-source voltage is super-linearly, which is not suitable for large current application. By using the high permittivity material, the device behavior could be improved.

Figure 13:
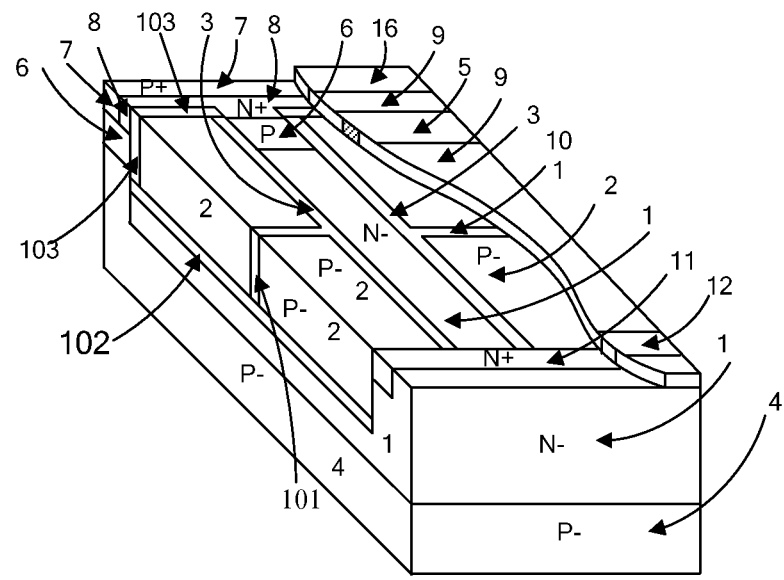
FIG. 13 shows the vertical cross section view of the device isolation region on the left.
Figure 14:
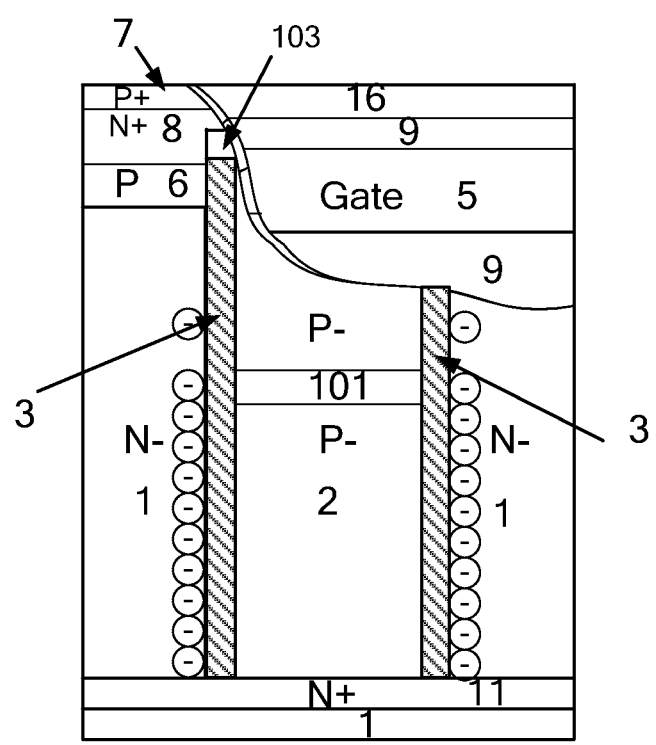
FIG. 14 shows the top view of cross section view at the surface of drift region and isolation region (only one isolation region is showed).

As showed in FIG. 13-14. The material and doping type of this embodiment is same as the embodiment 1 or the embodiment 3. The difference between FIG. 13 and FIG. 1 is that the insulation board 101 is placed inside of the isolation region. The material of insulation board 101 is same as the first dielectric material 10. The first filler material 2 directly contact the drain without any isolation. Also, it is can be described as that the material of end face sidewall 103 closed to drain 11 is same as the first filler material 2. The material of the end face sidewall 103 and the first filler material 2 are the same, which can be merged as one integral.

In another word, insulation board 101 is laterally placed inside of the isolation region; the insulation board divides the first filler material 2 into two parts: the part close to drain and part close to source. The part close to source contacts the gate 5 through the via on the second dielectric layer 9; the part close to drain directly contacts 11. Said 'laterally' means it perpendicular to the direction from source 8 to drain 11, and perpendicular to the substrate 4.

At the device on-state, because the insulation board 101 is laterally placed inside of the first filler material 2, the gate voltage only generates strong accumulation in part of the drift region 1 close to source 8 rather than the entire drift region 1, as a result, its specific on-resistance is larger than that of the embodiment 1. However, the other part of the first filler material 2 directly contacts the drain 11, its potential will be impacted by the drain voltage. If the drain voltage is high at the device on-state, the part of the first filler material 2 that closed to drain 11 will generate accumulation effect. As shown in FIG. 14, higher drain voltage brings stronger accumulation effect, so that the device specific on-resistance reduces with the rise of the voltage between drain and source. When the voltage between drain and source rises linearly, the current at the direction from drain to source rises super-linearly; the negative feedback is thereby formed, which is suitable for the application with large current. The isolation between the first filler material 2 and drain 11 can be replaced by insulation board in all embodiments above, to achieve the device behavior that the on-resistance drops with the rise of drain-source voltage.

What is claimed is:

1. A low specific on-resistance lateral power device using high permittivity material trench structure comprising: a silicon substrate (4), a drift region (1), a first dielectric layer (10), a gate (5), a channel region (6), an Ohm contact high doping region (7), a source (8), a drain (11), a second dielectric layer (9), a source contact (16), and a drain contact (12);

wherein said the drift region (1), drain (11), source (8) are of a first conductivity type, and the channel region (6), silicon substrate (4), Ohm contact high doping region (7) are of a second conductivity type; at least two isolation regions are placed into the drift region (1); the drift region (1) and channel region (6) located between the isolation regions; and each isolation extends from source (8) to drain (11);

wherein boundaries of the isolation region are formed by high permittivity material sockets (3) and the first dielectric layer (10) such that sidewall boundaries of the isolation region at a direction from the source to the drain are high permittivity material sockets (3) and bottom boundary and sidewall boundaries at the end face are set to be the first dielectric layer (10);

wherein said the isolation regions are filled with the first filler material type (2) inside, the surface of both drift region (1) and isolation region are covered by the second dielectric layer (9), gate (5) contacts the first filler material type (2) through the via on the second dielectric layer (9); the second dielectric layer (9) also covers the source (8), drain (11), and the channel region (6), the source contact (16) and drain contact (12) connect to source (8) and drain (11) respectively through the via on the second dielectric layer (9).

2. The low specific on-resistance lateral power device using high permittivity material trench structure according to claim 1, wherein said the first dielectric layer (10) comprises the end face sidewalls (103) and bottom (102) of the isolation region, both material of end face sidewalls (103) and bottom (102) are high permittivity material; alternatively, one of the material for end face sidewalls (102) and bottom (102) is high permittivity material.

3. The low specific on-resistance lateral power device using high permittivity material trench structure according to claim 2, wherein the lateral insulation board (101) is placed inside the isolation region; the insulation board divides the first filler material into two parts, the drain adjoining part and source adjoining part, the source adjoining part contacts the gate (5) though the via on the second dielectric layer (9), and the drain adjoining part contacts the drain (11); the first filler material type (2) is used as the material for the part of first insulation layer (10) at the end face sidewall (103) in the side of the drain (11).

4. The low specific on-resistance lateral power device using high permittivity material trench structure according to claim 1, wherein said the shape of isolation regions are cuboids, the boundary sidewalls perpendicular to substrate and in the direction from source (8) to drain (11) are high permittivity material sockets (3).

5. The low specific on-resistance lateral power device using high permittivity material trench structure according to claim 4, wherein said the internal high permittivity material sockets (13) are placed in the middle of two adjacent high permittivity material sockets (3) in the drift region (1) among the isolation regions wherein the internal high permittivity material sockets (13) are parallel with the high permittivity material sockets (3) and use the same material as the high permittivity material sockets (3), wherein both ends of internal high permittivity material socket directly contact the source (8) and the drain (11).

6. The low specific on-resistance lateral power device using high permittivity material trench structure according to claim 4, wherein said the internal high permittivity material sockets (13) are placed inside of the isolation regions, which parallel with the high permittivity material sockets (3) and use the same material as the high permittivity material sockets (3), wherein both ends of internal high permittivity material sockets (13) directly contact source (8) and drain (11).

7. The low specific on-resistance lateral power device using high permittivity material trench structure according to claim 1, wherein said the isolation regions are partially filled by the third filler material type (51) at the side of the source (8), wherein the third filler material type (51) uses the same material as the gate (5), and the gate (5) contacts the third filler material type (51) through the via on the second dielectric layer (9), the rest part of the isolations are filled by the first filler material (2), which is the same material as the high permittivity sockets (3).

8. The low specific on-resistance lateral power device using high permittivity material trench structure according to claim 1, wherein said the first filler material type is P– or N– silicon.

9. The low specific on-resistance lateral power device using high permittivity material trench structure according to claim 1, wherein the buffer layer (15) is deposited at both sides of the high permittivity material socket (3), wherein the material of buffer layer (15) is an insulation material.

10. The low specific on-resistance lateral power device using high permittivity material trench structure according to claim 9, wherein the material of buffer layer (15) is $SiO_2$.

11. The low specific on-resistance lateral power device using high permittivity material trench structure according to claim 1, wherein said the first conductivity type is N type silicon, the second conductivity type is P type silicon; or, the first conductivity type is P type silicon, the second conductivity type is N type silicon.

12. The low specific on-resistance lateral power device using high permittivity material trench structure according to claim 1, wherein the material of high permittivity material socket is dielectric material with actual dielectric constant larger than 3.9, or, insulation material mixed with conductive particle, or, composite material consists of both pseudo high permittivity material and insulation material with actual dielectric constant larger than 3.9.

13. A method for the fabrication of lateral low specific on-resistance power device with high permittivity trench, including the steps of:
1) coating a photoresist on a surface of an SOI wafer, then photoetched, developed and hardened, which is followed by the steps of ion implant with photoresist barrier, anneal, drive in, and wafer rinse; the above steps are repeated to finish all of the silicon doping including lateral super junction with alternating N– & P– doping, the channel region (6) doping and heavy doping for drain (11) and source (8);
2) using the $SiO_2$ burier isolation of the SOI wafer as the bottom (102) of the first dielectric layers (10), which isolates the first filler material type (10) from the substrate (4); meanwhile, the $SiO_2$ burier isolation of the SOI also isolates the drift region (1) from the substrate (4);
3) etching the wafer by RIE (Reactive Ion Etching) to make the trench from wafer surface to $SiO_2$ burier isolation, fill the trench with high permittivity material sockets (3) and the first dielectric layer (10), then, deposit the second dielectric layer (9); and
4) after the second dielectric layer (9) is deposited, the second dielectric layer (9) is etch with photoresist barrier to form the via, then, the metal is deposited and etched to form the drain contact (12), source contact (16) and metal gate (5).

14. A alternative method for the fabrication of lateral low specific on-resistance power device with high permittivity trench, including the steps of:
1) grow N type epitaxial on a non-SOI P type wafer, which is followed by the high energy oxide partial implantation with barrier on wafer surface to form a burier layer as a bottom (102) of the first dielectric layer (10);
2) coat a photoresist on the surface of the wafer, then photoetched, developed and hardened, which is followed by the steps of ion implant with photoresist barrier, anneal, drive in, and wafer rinse; the above steps are repeated to finish all of the silicon doping including lateral super junction with alternating N– & P– doping, the channel region doping and heavy doping for drain and source; and
3) etch the wafer using the RIE (Reactive Ion Etching) to make the trench from wafer surface to $SiO_2$ burier isolation, fill the trench with high permittivity material sockets (3) and the first dielectric layer (10) to isolate the first filler material (2) from substrate (4) and drift region (1), then, deposit the second dielectric layer (9) and etch the via, finally, deposit and etch the metal to finish the fabrication process.

* * * * *